United States Patent
An et al.

(10) Patent No.: US 12,355,216 B2
(45) Date of Patent: Jul. 8, 2025

(54) THREE-DIMENSIONAL (3D) COMPRESSIVE SENSING BASED EYE TRACKING

(71) Applicant: Meta Platforms Technologies, LLC, Menlo Park, CA (US)

(72) Inventors: Yatong An, Redmond, WA (US); Youmin Wang, Bellevue, WA (US); Zhaoyu Nie, Kenmore, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 270 days.

(21) Appl. No.: 18/087,322

(22) Filed: Dec. 22, 2022

(65) Prior Publication Data

US 2024/0213746 A1    Jun. 27, 2024

(51) Int. Cl.
*H01S 5/42* (2006.01)
*G01B 11/25* (2006.01)

(52) U.S. Cl.
CPC .......... *H01S 5/423* (2013.01); *G01B 11/2513* (2013.01)

(58) Field of Classification Search
CPC ........ H01S 5/183; H01S 5/423; H01S 5/0428; H01S 5/0071; H01S 5/4087; H01S 3/06754; H01S 3/094003; H01S 5/04256; H01S 5/4012; H01S 3/06758; H01S 3/0078; H01S 5/4075; H01S 5/06216; H01S 5/02345; H01S 3/094076; H01S 3/81608; H01S 3/06733; H01S 5/02253; H01S 3/094042; H01S 3/0941; H01S 5/0057; H01S 3/0085; H01S 5/0085; H01S 5/042; H01S 5/18394; H01S 3/2375; H01S 5/0262; H01S 5/18344; H01S 3/0675; H01S 5/146; H01S 5/4025; H01S 2301/02; H01S 3/0007; H01S 3/08086; H01S 3/10023; H01S 3/1106; H01S 3/2383; H01S 5/02469; H01S 3/09415; H01S 5/026; H01S 5/02325; H01S 5/18305; H01S 5/426; H01S 5/0239;
(Continued)

(56) References Cited

U.S. PATENT DOCUMENTS 9,412,185 B2   8/2016   Bernal et al.
9,514,364 B2   12/2016  Sheng et al.
(Continued)

FOREIGN PATENT DOCUMENTS

CN   217543539 U * 10/2022
EP   3789816 A1 * 3/2021 ............. A61B 3/024
(Continued)

*Primary Examiner* — Michael P Stafira
(74) *Attorney, Agent, or Firm* — Greenberg Traurig, LLP

(57) ABSTRACT

A three-dimensional (3D) compressive sensing based eye tracking system using single photon avalanche diode (SPAD) sensors achieves high resolution depth measurement by using low resolution SPAD sensors and active encoded illumination such as two- or three-dimensional fringe patterns, random speckles, random patterns, and/or superimposed patterns projected onto a surface of an eye. The patterns may be projected by high speed illuminators such as a digital micromirror device (DMD) or microelectromechanical system (MEMS) projector in series changing at the same rate as the SPAD sensor capture rate. A processor may employ compressive sensing techniques to obtain a high resolution image and depth information from the captured images of varying patterns.

20 Claims, 10 Drawing Sheets

(58) Field of Classification Search
CPC .............. H01S 5/18361; H01S 5/04254; H01S 5/18377; H01S 5/02326; H01S 5/0421; H01S 5/06243; H01S 5/0683; H01S 5/005; H01S 3/10015; H01S 5/0216; H01S 5/02315; H01S 5/06825; H01S 5/125; H01S 5/32; H01S 5/40; H01S 3/005; H01S 5/0287; H01S 5/062; H01S 3/0064; H01S 3/302; H01S 5/0028; H01S 5/02255; H01S 5/0234; H01S 5/0265; H01S 5/18369; H01S 5/50; H01S 5/02375; H01S 5/0261; H01S 5/4031; H01S 3/025; H01S 3/067; H01S 3/094007; H01S 5/0237; H01S 5/04257; H01S 5/12; H01S 5/18311; H01S 5/18341; H01S 5/18347; H01S 5/4018; H01S 3/094096; H01S 5/02257; H01S 5/0264; H01S 5/0615; H01S 5/1838; H01S 5/42; H01S 5/0217; H01S 5/024; H01S 5/06804; H01S 5/06808; H01S 5/18397; H01S 5/30; H01S 5/3201; H01S 5/32341; H01S 5/3235; H01S 5/4037; H01S 2304/04; H01S 3/0092; H01S 3/13; H01S 3/1618; H01S 5/02208; H01S 5/02218; H01S 5/02415; H01S 5/04253; H01S 5/0617; H01S 5/0656; H01S 5/1017; H01S 5/18375; H01S 5/18388; H01S 5/2072; H01S 5/209; H01S 5/22; H01S 3/0612; H01S 3/0627; H01S 3/094011; H01S 3/1001; H01S 3/113; H01S 3/1643; H01S 3/2316; H01S 5/0078; H01S 5/0425; H01S 5/0427; H01S 5/1039; H01S 3/0621; H01S 3/08077; H01S 3/094053; H01S 3/094061; H01S 3/1062; H01S 3/1611; H01S 3/1673; H01S 3/2333; H01S 5/0206; H01S 5/028; H01S 5/0601; H01S 5/0625; H01S 5/06253; H01S 5/0655; H01S 5/06835; H01S 5/1003; H01S 5/1064; H01S 5/1071; H01S 5/18308; H01S 5/18386; H01S 5/2086; H01S 5/2202; H01S 5/3054; H01S 5/3086; H01S 5/32316; H01S 3/061; H01S 3/0912; H01S 3/1115; H01S 3/2391; H01S 5/0213; H01S 5/02212; H01S 5/02234; H01S 5/0233; H01S 5/06203; H01S 5/1014; H01S 5/3095; H01S 3/0071; H01S 3/094015; H01S 3/10069; H01S 5/0207; H01S 5/02251; H01S 5/0235; H01S 5/1092; H01S 5/141; H01S 5/18313; H01S 5/18322; H01S 5/18327; H01S 2301/176; H01S 3/0057; H01S 3/08; H01S 3/094084; H01S 3/10046; H01S 3/1022; H01S 3/1603; H01S 3/30; H01S 5/0014; H01S 5/0215; H01S 5/022; H01S 5/023; H01S 5/0232; H01S 5/0608; H01S 5/068; H01S 5/1835; H01S 5/18391; H01S 5/3013; H01S 5/34; H01S 5/34313; H01S 5/4043; H01S 5/405; H01S 5/5027; H01S 3/0014; H01S 3/06725; H01S 3/1061; H01S 3/2308; H01S 5/00; H01S 5/0202; H01S 5/021; H01S 5/02216; H01S 5/0222; H01S 5/02355; H01S 5/02407; H01S 5/0614; H01S 5/0622; H01S 5/0687; H01S 5/18302; H01S 5/18319; H01S 5/18325; H01S 5/18358; H01S 5/18383; H01S 5/187; H01S 5/3401; H01S 5/3402; H01S 5/4006; H01S 3/06704; H01S 3/06712; H01S 3/06716; H01S 3/06729; H01S 3/06745; H01S 3/06766; H01S 3/06783; H01S 3/08009; H01S 3/0805; H01S 3/08059; H01S 3/09; H01S 3/091; H01S 3/09408; H01S 3/1086; H01S 5/0035; H01S 5/0218; H01S 5/0225; H01S 5/0236; H01S 5/02461; H01S 5/02476; H01S 5/0267; H01S 5/0282; H01S 5/0422; H01S 5/06226; H01S 5/06233; H01S 5/0658; H01S 5/06821; H01S 5/11; H01S 5/18; H01S 5/1833; H01S 5/18333; H01S 5/18363; H01S 5/18366; H01S 5/32308; H01S 5/3416; H01S 5/343; H01S 5/3432; G01B 11/22; G01B 11/24; G01B 11/026; G01B 11/14; G01B 11/2513; G01B 11/25; G01B 11/26; G01B 11/2518; G01B 11/245; G01B 11/00; G01B 11/02; G01B 11/0608; G01B 15/00; G01B 11/30; G01B 11/0658; G01B 11/04; G01B 11/03; G01B 21/22; G01B 7/30; G01B 9/02002; G01B 9/0201; G01B 9/02031; G01B 9/02091; G01B 11/022; G01B 11/254; G01B 5/02; G01B 11/002; G01B 11/005; G01B 11/024; G01B 11/2504; G01B 11/2522; G01B 11/2545; G01B 11/27; G01B 15/04; G01B 17/06; G01B 21/00; G01B 21/04; G01B 21/042; G01B 21/24; G01B 5/008; G01B 9/02004; G01B 9/02014; G01B 9/0203; G01B 9/02092; G02B 27/0172; G02B 27/0093; G02B 2027/0178; G02B 2027/0187; G02B 2027/0138; G02B 27/017; G02B 27/0179; G02B 2027/0174; G02B 27/0075; G02B 30/27; G02B 5/32; G02B 27/0081; G02B 6/0016; G02B 6/34; G02B 2027/0134; G02B 2027/014; G02B 5/20; G02B 2027/0105; G02B 2027/012; G02B 26/0825; G02B 27/0018; G02B 27/0025; G02B 27/0101; G02B 27/286; G02B 6/0055; G02B 2027/0107; G02B 2027/0109; G02B 2027/0127; G02B 2207/123; G02B 26/0816; G02B 27/0176; G02B 27/141; G02B 27/4205; G02B 27/425; G02B 27/44; G02B 3/08; G02B 5/04; G02B 5/208; G02B 5/281; G02B 5/285; G02B 6/0011; G02B 6/0031; G02B 6/0035; G02B 6/005; G02B 6/0066; G02B 6/02085; G02B 6/3518; G02B 1/115; G02B 2027/011; G02B 2027/0125; G02B 2027/0132; G02B 2027/0156; G02B 2027/0185; G02B 26/0858; G02B 27/0103; G02B 27/149;

G02B 27/283; G02B 27/58; G02B 30/10;
G02B 30/26; G02B 5/1861; G02B
5/3025; G02B 6/0015; G02B 6/0036
See application file for complete search history.

(56) References Cited

U.S. PATENT DOCUMENTS

| | | | |
|---|---|---|---|
| 10,520,742 B1 * | 12/2019 | Sulai | G02B 27/0172 |
| 10,585,477 B1 * | 3/2020 | Cavin | G06F 3/013 |
| 10,838,489 B2 | 11/2020 | Price et al. | |
| 10,928,894 B2 * | 2/2021 | Bitauld | A61B 3/113 |
| 10,977,815 B1 * | 4/2021 | Chao | G06F 3/013 |
| 11,340,109 B2 | 5/2022 | Hennecke et al. | |
| 2018/0173303 A1 * | 6/2018 | Liu | G06F 1/325 |
| 2022/0174188 A1 * | 6/2022 | Price | G06T 7/20 |
| 2023/0280468 A1 * | 9/2023 | Zhu | G01S 7/4816 |
| | | | 356/5.01 |

FOREIGN PATENT DOCUMENTS

| | | | | |
|---|---|---|---|---|
| WO | WO-2016174659 A1 * | 11/2016 | | G06F 1/163 |
| WO | WO-2022235323 A1 * | 11/2022 | | G01B 11/2536 |

* cited by examiner

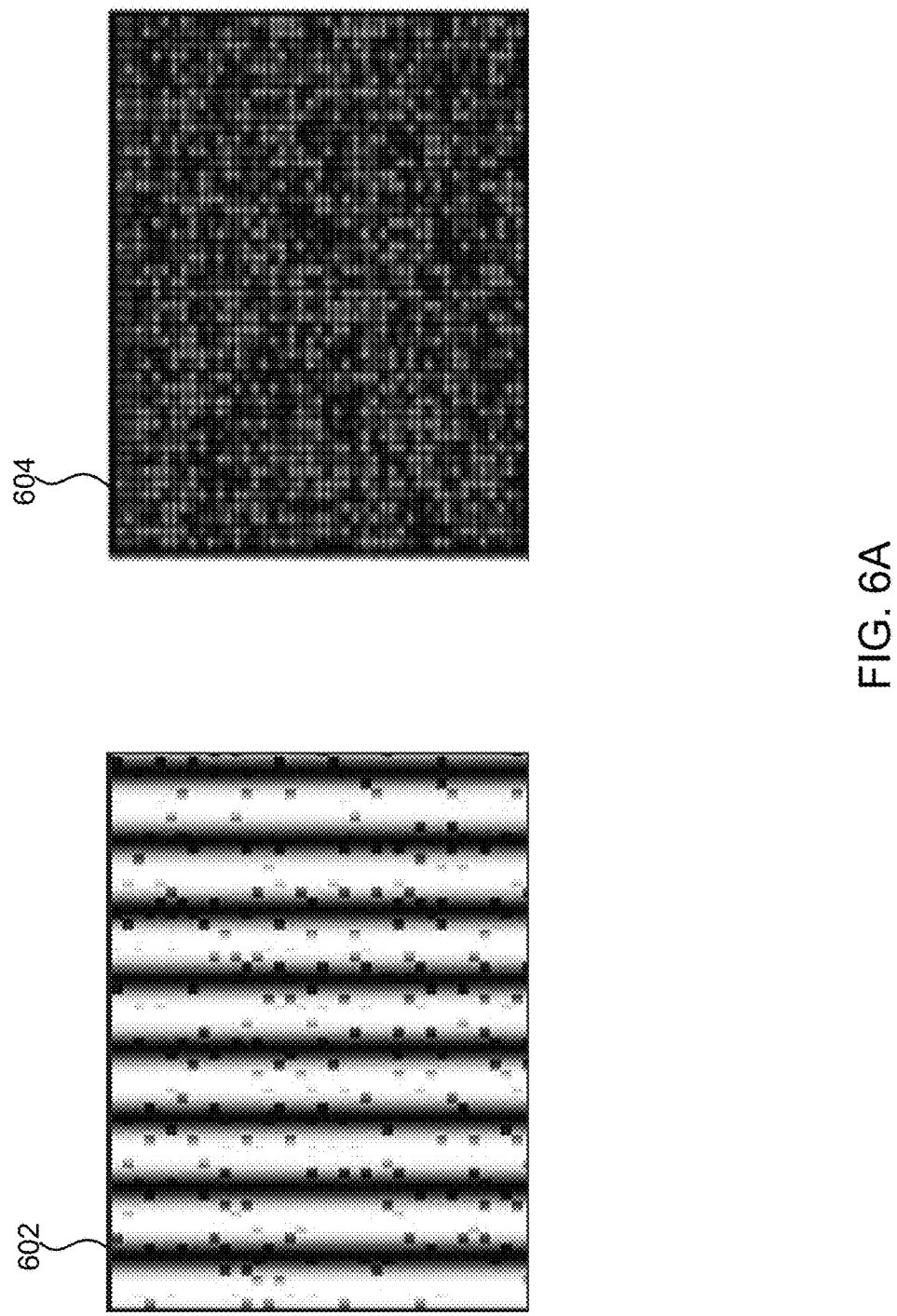

THREE-DIMENSIONAL (3D) COMPRESSIVE SENSING BASED EYE TRACKING

TECHNICAL FIELD

This patent application relates generally to eye tracking in near-eye display devices, and in particular, to three-dimensional (3D) compressive sensing based eye tracking using single photon avalanche diode (SPAD) sensors.

BACKGROUND

With recent advances in technology, prevalence and proliferation of content creation and delivery has increased greatly in recent years. In particular, interactive content such as virtual reality (VR) content, augmented reality (AR) content, mixed reality (MR) content, and content within and associated with a real and/or virtual environment (e.g., a "metaverse") has become appealing to consumers.

To facilitate delivery of this and other related content, service providers have endeavored to provide various forms of wearable display systems. One such example may be a head-mounted display (HMD) device, such as a wearable eyewear, a wearable headset, or eyeglasses. In some examples, the head-mounted display (HMD) device may project or direct light to may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment. Head-mounted display (HMD) devices may also present interactive content, where a user's (wearer's) gaze may be used as input for the interactive content.

BRIEF DESCRIPTION OF DRAWINGS

Features of the present disclosure are illustrated by way of example and not limited in the following figures, in which like numerals indicate like elements. One skilled in the art will readily recognize from the following that alternative examples of the structures and methods illustrated in the figures can be employed without departing from the principles described herein.

FIGS. 6A-6B illustrate example patterns that may be projected onto an eye surface for three-dimensional (3D) compressive sensing based eye tracking, according to examples.

DETAILED DESCRIPTION

Figure 1:
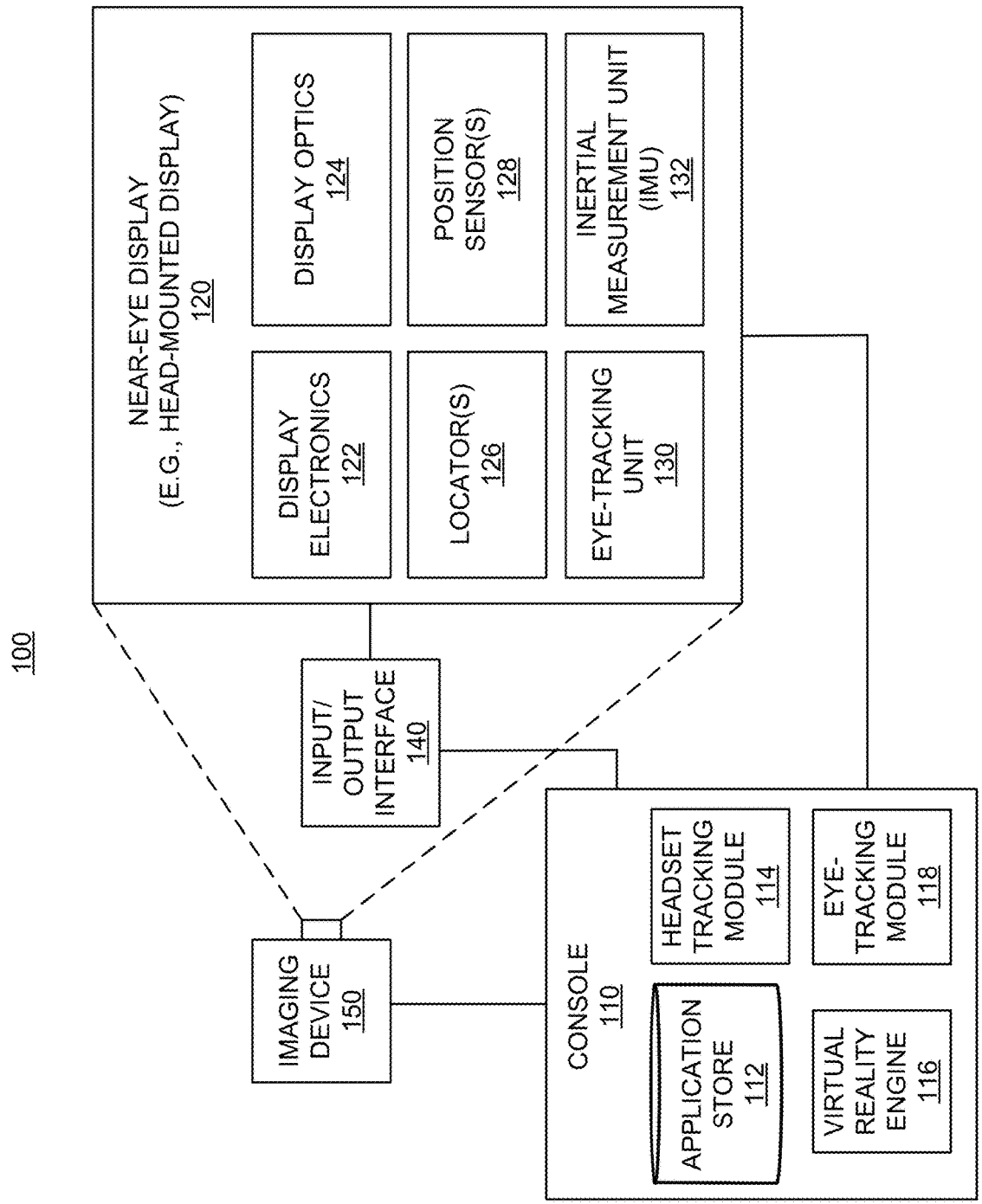
FIG. 1 illustrates a block diagram of an artificial reality system environment including a near-eye display, according to an example.

For simplicity and illustrative purposes, the present application is described by referring mainly to examples thereof. In the following description, numerous specific details are set forth in order to provide a thorough understanding of the present application. It will be readily apparent, however, that the present application may be practiced without limitation to these specific details. In other instances, some methods and structures readily understood by one of ordinary skill in the art have not been described in detail so as not to unnecessarily obscure the present application. As used herein, the terms "a" and "an" are intended to denote at least one of a particular element, the term "includes" means includes but not limited to, the term "including" means including but not limited to, and the term "based on" means based at least in part on.

Tracking a position and orientation of the eye as well as gaze direction in head-mounted display (HMD) devices may unlock display and rendering architectures that can substantially alleviate the power and computational requirements to render 3D environments. Furthermore, eye-tracking enabled gaze prediction and intent inference can enable intuitive and immersive user experiences adaptive to the user requirements in his/her interaction with the virtual environment.

Eye tracking may be achieved via a number of techniques. Fringe projection, which projects a periodical pattern onto the eye and uses the reflected pattern to determine three-dimensional (3D) features, is one technique. Another technique utilizes time-of-flight analysis of light projected onto the eye. These and similar techniques involve projection of light, for example, laser light onto the eye and capture of the reflection from the eye at a near distance.

Eye motion can achieve up to 1000 degrees per second. Thus, high speed measurement is critical for eye tracking applications. Thus, to achieve ultra-high speed eye tracking beyond 1000 frame per second using structured light sensing, both fast illumination and fast detection may be needed. For augmented reality (AR)/virtual reality (VR) eye tracking applications, strict size and power requirements limit the use of traditional illumination apparatus such as digital light processing (DLP) and liquid crystal technology on silicon (LCOS) based projectors. Such high image capture speeds are also difficult to achieve with cameras (unless specialty cameras are used). Specifically, small form factor cameras used in near-eye display devices may be incapable of achieving such capture rates. Single photon avalanche diode (SPAD) sensors are small form factor sensors that can achieve ultra-fast speeds. However, single photon avalanche diode (SPAD) sensors have their own challenges in eye tracking applications, such as limited bandwidth, low resolution, and/or noise susceptibility to name a few.

In some examples of the present disclosure, a three-dimensional (3D) compressive sensing based eye tracking system using single photon avalanche diode (SPAD) sensors is described. To achieve high resolution depth measurement by using low resolution single-photon avalanche diode (SPAD) sensors, active encoded illumination such as two- or three-dimensional fringe patterns, random speckles, random patterns, and/or superimposed patterns may be projected onto a surface of an eye, and a reflection of the projected pattern may be captured by single-photon avalanche diode (SPAD) sensor(s). Forward observation model and multiple measurements can be used for higher resolution three-dimensional (3D) results. High speed illuminators such as digital micromirror devices (DMDs) or micro-electromechanical systems (MEMS) may be used changing patterns at the same rate as the single-photon avalanche diode (SPAD) sensor(s). A processor may employ compressive sensing techniques to obtain a high resolution image and depth information from the captured images of varying patterns. By changing the projection of patterns and capture speed (synchronously) rapidly, high resolution information may be captured at a faster rate.

While some advantages and benefits of the present disclosure are apparent, other advantages and benefits may include reduction of computational resources and increased speed of eye tracking without added complexity of high-speed cameras to the eye tracking system. Furthermore, an accuracy and/or power consumption efficiency of the eye tracking system may also be increased.

FIG. 1 illustrates a block diagram of an artificial reality system environment 100 including a near-eye display, according to an example. As used herein, a "near-eye display" may refer to a device (e.g., an optical device) that may be in close proximity to a user's eye. As used herein, "artificial reality" may refer to aspects of, among other things, a "metaverse" or an environment of real and virtual elements and may include use of technologies associated with virtual reality (VR), augmented reality (AR), and/or mixed reality (MR). As used herein a "user" may refer to a user or wearer of a "near-eye display."

As shown in FIG. 1, the artificial reality system environment 100 may include a near-eye display 120, an optional external imaging device 150, and an optional input/output interface 140, each of which may be coupled to a console 110. The console 110 may be optional in some instances as the functions of the console 110 may be integrated into the near-eye display 120. In some examples, the near-eye display 120 may be a head-mounted display (HMD) that presents content to a user.

In some instances, for a near-eye display system, it may generally be desirable to expand an eye box, reduce display haze, improve image quality (e.g., resolution and contrast), reduce physical size, increase power efficiency, and increase or expand field of view (FOV). As used herein, "field of view" (FOV) may refer to an angular range of an image as seen by a user, which is typically measured in degrees as observed by one eye (for a monocular head-mounted display (HMD)) or both eyes (for binocular head-mounted displays (HMDs)). Also, as used herein, an "eye box" may be a two-dimensional box that may be positioned in front of the user's eye from which a displayed image from an image source may be viewed.

In some examples, in a near-eye display system, light from a surrounding environment may traverse a "see-through" region of a waveguide display (e.g., a transparent substrate) to reach a user's eyes. For example, in a near-eye display system, light of projected images may be coupled into a transparent substrate of a waveguide, propagate within the waveguide, and be coupled or directed out of the waveguide at one or more locations to replicate exit pupils and expand the eye box.

In some examples, the near-eye display 120 may include one or more rigid bodies, which may be rigidly or non-rigidly coupled to each other. In some examples, a rigid coupling between rigid bodies may cause the coupled rigid bodies to act as a single rigid entity, while in other examples, a non-rigid coupling between rigid bodies may allow the rigid bodies to move relative to each other.

In some examples, the near-eye display 120 may be implemented in any suitable form-factor, including a head-mounted display (HMD), a pair of glasses, or other similar wearable eyewear or device. Examples of the near-eye display 120 are further described below with respect to FIGS. 2 and 3. Additionally, in some examples, the functionality described herein may be used in a head-mounted display (HMD) or headset that may combine images of an environment external to the near-eye display 120 and artificial reality content (e.g., computer-generated images). Therefore, in some examples, the near-eye display 120 may augment images of a physical, real-world environment external to the near-eye display 120 with generated and/or overlaid digital content (e.g., images, video, sound, etc.) to present an augmented reality to a user.

In some examples, the near-eye display 120 may include any number of display electronics 122, display optics 124, and an eye tracking unit 130. In some examples, the near-eye display 120 may also include one or more locators 126, one or more position sensors 128, and an inertial measurement unit (IMU) 132. In some examples, the near-eye display 120 may omit any of the eye tracking unit 130, the one or more locators 126, the one or more position sensors 128, and the inertial measurement unit (IMU) 132, or may include additional elements.

In some examples, the display electronics 122 may display or facilitate the display of images to the user according to data received from, for example, the optional console 110. In some examples, the display electronics 122 may include one or more display panels. In some examples, the display electronics 122 may include any number of pixels to emit light of a predominant color such as red, green, blue, white, or yellow. In some examples, the display electronics 122 may display a three-dimensional (3D) image, e.g., using stereoscopic effects produced by two-dimensional panels, to create a subjective perception of image depth.

In some examples, the near-eye display 120 may include a projector (not shown), which may form an image in angular domain for direct observation by a viewer's eye through a pupil. The projector may employ a controllable light source (e.g., a laser source) and a micro-electromechanical system (MEMS) beam scanner to create a light field from, for example, a collimated light beam. In some examples, the same projector or a different projector may be used to project a fringe pattern on the eye, which may be captured by a camera and analyzed (e.g., by the eye tracking unit 130) to determine a position of the eye (the pupil), a gaze, etc.

In some examples, the display optics 124 may display image content optically (e.g., using optical waveguides and/or couplers) or magnify image light received from the display electronics 122, correct optical errors associated with the image light, and/or present the corrected image light to a user of the near-eye display 120. In some examples, the display optics 124 may include a single optical element or any number of combinations of various optical elements as well as mechanical couplings to maintain relative spacing and orientation of the optical elements in the combination. In some examples, one or more optical elements in the display optics 124 may have an optical coating, such as an anti-reflective coating, a reflective coating, a filtering coating, and/or a combination of different optical coatings.

In some examples, the display optics 124 may also be designed to correct one or more types of optical errors, such as two-dimensional optical errors, three-dimensional optical errors, or any combination thereof. Examples of two-dimensional errors may include barrel distortion, pincushion distortion, longitudinal chromatic aberration, and/or transverse chromatic aberration. Examples of three-dimensional errors may include spherical aberration, chromatic aberration field curvature, and astigmatism.

In some examples, the one or more locators 126 may be objects located in specific positions relative to one another and relative to a reference point on the near-eye display 120. In some examples, the optional console 110 may identify the one or more locators 126 in images captured by the optional external imaging device 150 to determine the artificial reality headset's position, orientation, or both. The one or more locators 126 may each be a light-emitting diode (LED), a corner cube reflector, a reflective marker, a type of light source that contrasts with an environment in which the near-eye display 120 operates, or any combination thereof.

In some examples, the external imaging device 150 may include one or more cameras, one or more video cameras, any other device capable of capturing images including the one or more locators 126, or any combination thereof. The optional external imaging device 150 may be configured to detect light emitted or reflected from the one or more locators 126 in a field of view of the optional external imaging device 150.

In some examples, the one or more position sensors 128 may generate one or more measurement signals in response to motion of the near-eye display 120. Examples of the one or more position sensors 128 may include any number of accelerometers, gyroscopes, magnetometers, and/or other motion-detecting or error-correcting sensors, or any combination thereof.

In some examples, the inertial measurement unit (IMU) 132 may be an electronic device that generates fast calibration data based on measurement signals received from the one or more position sensors 128. The one or more position sensors 128 may be located external to the inertial measurement unit (IMU) 132, internal to the inertial measurement unit (IMU) 132, or any combination thereof. Based on the one or more measurement signals from the one or more position sensors 128, the inertial measurement unit (IMU) 132 may generate fast calibration data indicating an estimated position of the near-eye display 120 that may be relative to an initial position of the near-eye display 120. For example, the inertial measurement unit (IMU) 132 may integrate measurement signals received from accelerometers over time to estimate a velocity vector and integrate the velocity vector over time to determine an estimated position of a reference point on the near-eye display 120. Alternatively, the inertial measurement unit (IMU) 132 may provide the sampled measurement signals to the optional console 110, which may determine the fast calibration data.

The eye tracking unit 130 may include one or more eye tracking systems. As used herein, "eye tracking" may refer to determining an eye's position or relative position, including orientation, location, and/or gaze of a user's eye. In some examples, an eye tracking system may include an imaging system that captures one or more images of an eye and may optionally include a light emitter, which may generate light (e.g., a fringe pattern) that is directed to an eye such that light reflected by the eye may be captured by the imaging system (e.g., a camera). In other examples, the eye tracking unit 130 may capture reflected radio waves emitted by a miniature radar unit. These data associated with the eye may be used to determine or predict eye position, orientation, movement, location, and/or gaze.

In some examples, the near-eye display 120 may use the orientation of the eye to introduce depth cues (e.g., blur image outside of the user's main line of sight), collect heuristics on the user interaction in the virtual reality (VR) media (e.g., time spent on any particular subject, object, or frame as a function of exposed stimuli), some other functions that are based in part on the orientation of at least one of the user's eyes, or any combination thereof. In some examples, because the orientation may be determined for both eyes of the user, the eye tracking unit 130 may be able to determine where the user is looking or predict any user patterns, etc.

In some examples, the input/output interface 140 may be a device that allows a user to send action requests to the optional console 110. As used herein, an "action request" may be a request to perform a particular action. For example, an action request may be to start or to end an application or to perform a particular action within the application. The input/output interface 140 may include one or more input devices. Example input devices may include a keyboard, a mouse, a game controller, a glove, a button, a touch screen, or any other suitable device for receiving action requests and communicating the received action requests to the optional console 110. In some examples, an action request received by the input/output interface 140 may be communicated to the optional console 110, which may perform an action corresponding to the requested action.

In some examples, the optional console 110 may provide content to the near-eye display 120 for presentation to the user in accordance with information received from one or more of external imaging device 150, the near-eye display 120, and the input/output interface 140. For example, in the example shown in FIG. 1, the optional console 110 may include an application store 112, a headset tracking module 114, a virtual reality engine 116, and an eye tracking module 118. Some examples of the optional console 110 may include different or additional modules than those described in conjunction with FIG. 1. Functions further described below may be distributed among components of the optional console 110 in a different manner than is described here.

In some examples, the optional console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In some examples, the modules of the optional console 110 described in conjunction with FIG. 1 may be encoded as instructions in the non-transitory computer-readable storage medium that, when executed by the processor, cause the processor to perform the functions further described below. It should be appreciated that the optional console 110 may or may not be needed or the optional console 110 may be integrated with or separate from the near-eye display 120.

In some examples, the application store 112 may store one or more applications for execution by the optional console 110. An application may include a group of instructions that, when executed by a processor, generates content for presentation to the user. Examples of the applications may include gaming applications, conferencing applications, video playback application, or other suitable applications.

In some examples, the headset tracking module 114 may track movements of the near-eye display 120 using slow calibration information from the external imaging device 150. For example, the headset tracking module 114 may determine positions of a reference point of the near-eye display 120 using observed locators from the slow calibration information and a model of the near-eye display 120. Additionally, in some examples, the headset tracking module 114 may use portions of the fast calibration information, the slow calibration information, or any combination thereof, to predict a future location of the near-eye display 120. In some examples, the headset tracking module 114 may provide the estimated or predicted future position of the near-eye display 120 to the virtual reality engine 116.

In some examples, the virtual reality engine 116 may execute applications within the artificial reality system environment 100 and receive position information of the near-eye display 120, acceleration information of the near-eye display 120, velocity information of the near-eye display 120, predicted future positions of the near-eye display 120, or any combination thereof from the headset tracking module 114. In some examples, the virtual reality engine 116 may also receive estimated eye position and orientation information from the eye tracking module 118. Based on the received information, the virtual reality engine 116 may determine content to provide to the near-eye display 120 for presentation to the user.

In some examples, the eye tracking module 118, which may be implemented as a processor, may receive eye tracking data from the eye tracking unit 130 and determine the position of the user's eye based on the eye tracking data. In some examples, the position of the eye may include an eye's orientation, location, or both relative to the near-eye display 120 or any element thereof. So, in these examples, because the eye's axes of rotation change as a function of the eye's location in its socket, determining the eye's location in its socket may allow the eye tracking module 118 to more accurately determine the eye's orientation.

In some examples, a location of a projector of a display system may be adjusted to enable any number of design modifications. For example, in some instances, a projector may be located in front of a viewer's eye (i.e., "front-mounted" placement). In a front-mounted placement, in some examples, a projector of a display system may be located away from a user's eyes (i.e., "world-side"). In some examples, a head-mounted display (HMD) device may utilize a front-mounted placement to propagate light towards a user's eye(s) to project an image.

Figure 2:
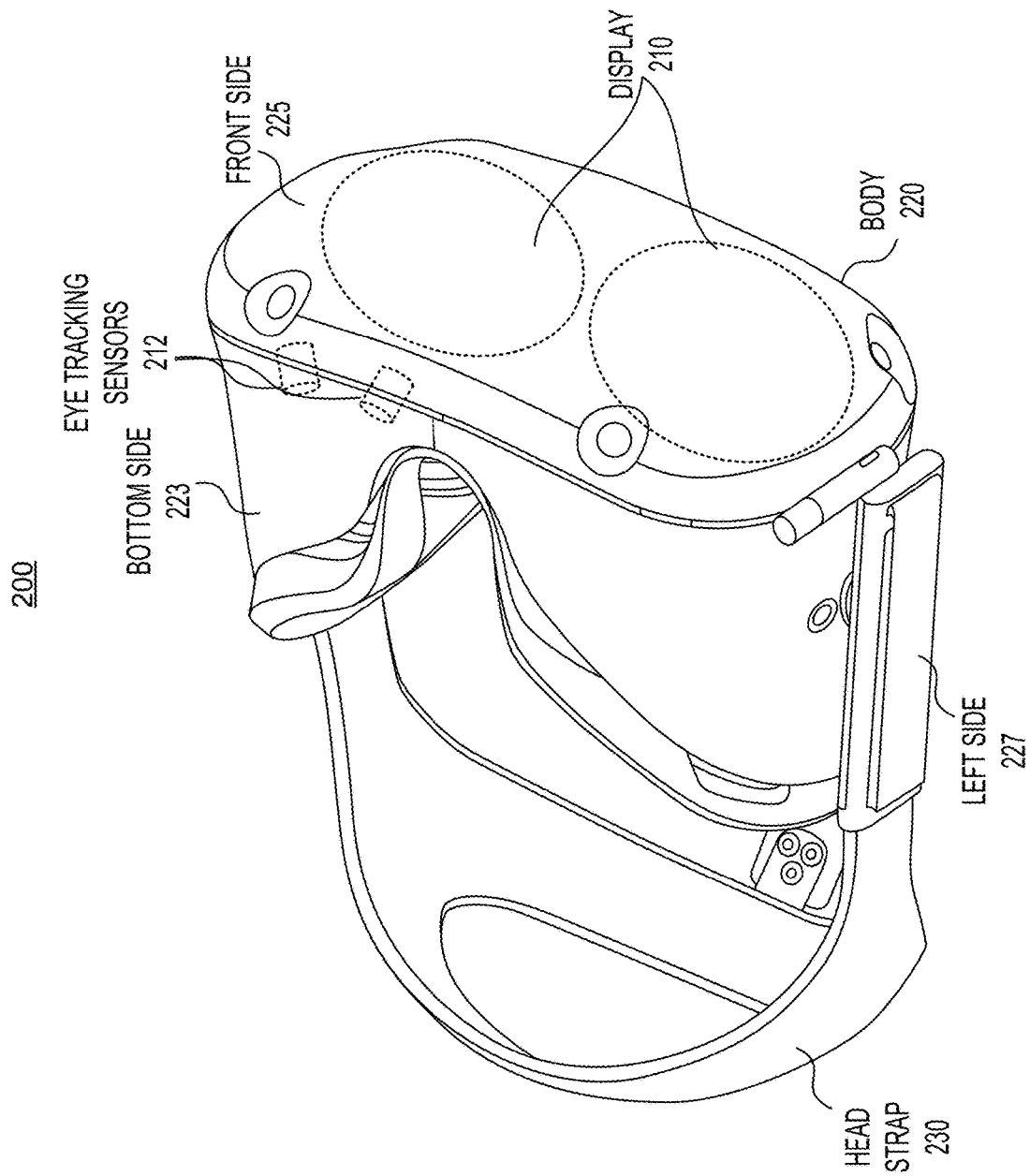
FIG. 2 illustrates a perspective view of a near-eye display in the form of a head-mounted display (HMD) device, according to an example.

FIG. 2 illustrates a perspective view of a near-eye display in the form of a head-mounted display (HMD) device 200, according to an example. In some examples, the head-mounted device (HMD) device 200 may be a part of a virtual reality (VR) system, an augmented reality (AR) system, a mixed reality (MR) system, another system that uses displays or wearables, or any combination thereof. In some examples, the head-mounted display (HMD) device 200 may include a body 220 and a head strap 230. FIG. 2 shows a bottom side 223, a front side 225, and a left side 227 of the body 220 in the perspective view. In some examples, the head strap 230 may have an adjustable or extendible length. In particular, in some examples, there may be a sufficient space between the body 220 and the head strap 230 of the head-mounted display (HMD) device 200 for allowing a user to mount the head-mounted display (HMD) device 200 onto the user's head. For example, the length of the head strap 230 may be adjustable to accommodate a range of user head sizes. In some examples, the head-mounted display (HMD) device 200 may include additional, fewer, and/or different components.

In some examples, the head-mounted display (HMD) device 200 may present, to a user, media or other digital content including virtual and/or augmented views of a physical, real-world environment with computer-generated elements. Examples of the media or digital content presented by the head-mounted display (HMD) device 200 may include images (e.g., two-dimensional (2D) or three-dimensional (3D) images), videos (e.g., 2D or 3D videos), audio, or any combination thereof. In some examples, the images and videos may be presented to each eye of a user by one or more display assemblies (not shown in FIG. 2) enclosed in the body 220 of the head-mounted display (HMD) device 200.

In some examples, the head-mounted display (HMD) device 200 may include various sensors (not shown), such as depth sensors, motion sensors, position sensors, and/or eye tracking sensors. Some of these sensors may use any number of structured or unstructured light patterns for sensing purposes. In some examples, the head-mounted display (HMD) device 200 may include an input/output interface 140 for communicating with a console 110, as described with respect to FIG. 1. In some examples, the head-mounted display (HMD) device 200 may include a virtual reality engine (not shown), but similar to the virtual reality engine 116 described with respect to FIG. 1, that may execute applications within the head-mounted display (HMD) device 200 and receive depth information, position information, acceleration information, velocity information, predicted future positions, or any combination thereof of the head-mounted display (HMD) device 200 from the various sensors.

In some examples, the information received by the virtual reality engine 116 may be used for producing a signal (e.g., display instructions) to the one or more display assemblies. In some examples, the head-mounted display (HMD) device 200 may include locators (not shown), but similar to the locators 126 described in FIG. 1, which may be located in fixed positions on the body 220 of the head-mounted display (HMD) device 200 relative to one another and relative to a reference point. Each of the locators may emit light that is detectable by an external imaging device. This may be useful for the purposes of head tracking or other movement/orientation. It should be appreciated that other elements or components may also be used in addition or in lieu of such locators.

It should be appreciated that in some examples, a projector mounted in a display system may be placed near and/or closer to a user's eye (i.e., "eye-side"). In some examples, and as discussed herein, a projector for a display system shaped liked eyeglasses may be mounted or positioned in a temple arm (i.e., a top far corner of a lens side) of the eyeglasses. It should be appreciated that, in some instances, utilizing a back-mounted projector placement may help to reduce size or bulkiness of any required housing required for a display system, which may also result in a significant improvement in user experience for a user.

In some examples, the projector may provide a structured light (fringe pattern) onto the eye which may be captured by the eye tracking sensors 212. The eye tracking sensors 212 or a communicatively coupled processor (e.g., eye tracking module 118 in FIG. 1) may analyze the captured reflection of the fringe pattern and analyze to generate a phase map of the fringe pattern, which may provide depth information for the eye and its structures. In other examples, the projector may include a micro-electromechanical system (MEMS) to reflect laser light and create a pattern or a digital micromirror device (DMD) to create random or active encoded illumination patterns. On the detection side, single-photon avalanche diode (SPAD) based sensors may be used in conjunction with compressive sensing techniques to obtain a high resolution image of the surface of the eye from low resolution images captured by the single-photon avalanche diode (SPAD) based sensors.

Figure 3A:
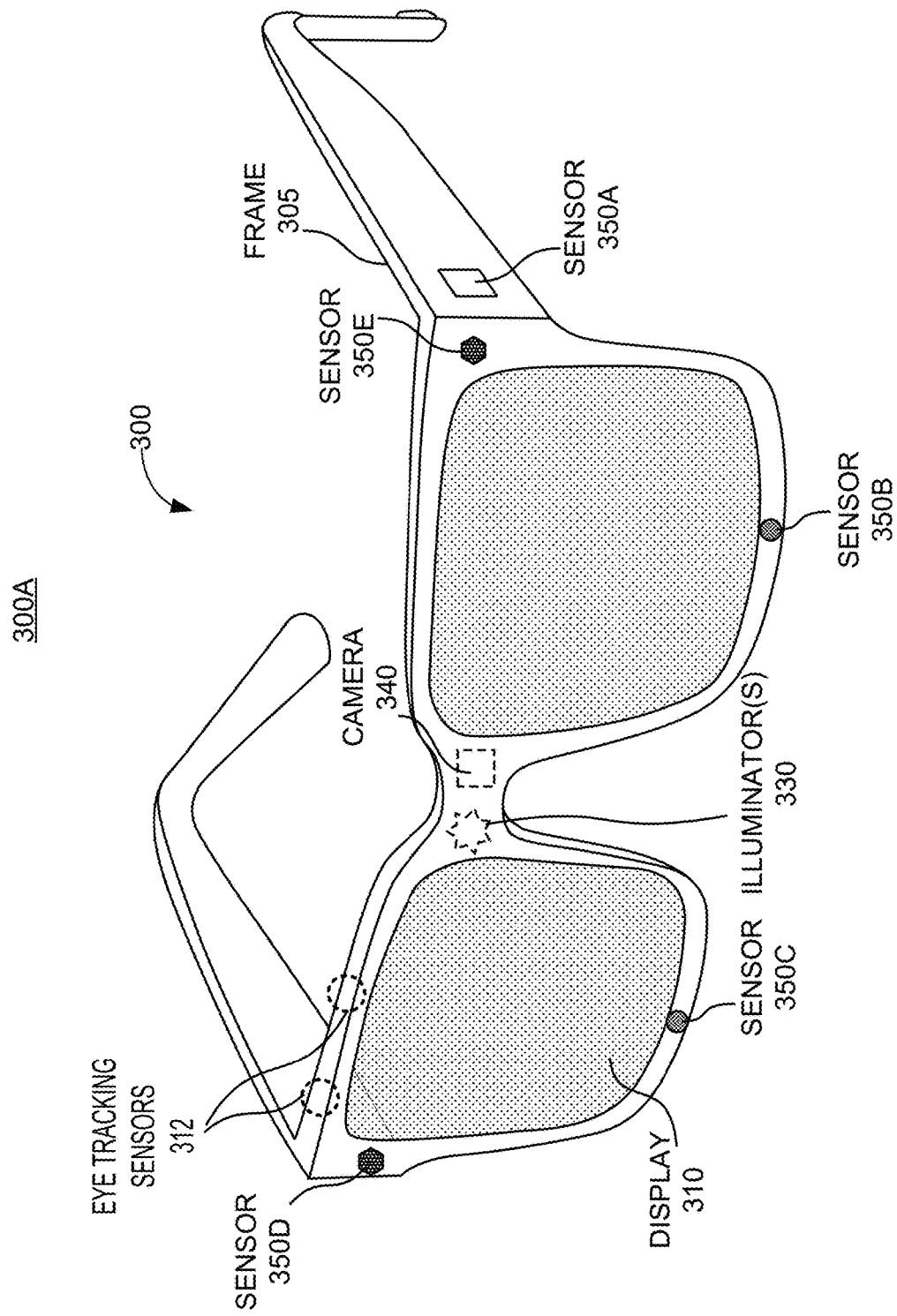
FIGS. 3A and 3B illustrate a perspective view and a top view of a near-eye display in the form of a pair of glasses, according to an example.

FIG. 3A is a perspective view 300A of a near-eye display 300 in the form of a pair of glasses (or other similar eyewear), according to an example. In some examples, the near-eye display 300 may be a specific example of near-eye display 120 of FIG. 1 and may be configured to operate as a virtual reality display, an augmented reality (AR) display, and/or a mixed reality (MR) display.

In some examples, the near-eye display 300 may include a frame 305 and a display 310. In some examples, the display 310 may be configured to present media or other content to a user. In some examples, the display 310 may include display electronics and/or display optics, similar to components described with respect to FIGS. 1-2. For example, as described above with respect to the near-eye display 120 of FIG. 1, the display 310 may include a liquid crystal display (LCD) display panel, a light-emitting diode (LED) display panel, or an optical display panel (e.g., a waveguide display assembly). In some examples, the display 310 may also include any number of optical components, such as waveguides, gratings, lenses, mirrors, etc. In other examples, the display 210 may include a projector, or in place of the display 310 the near-eye display 300 may include a projector.

In some examples, the near-eye display 300 may further include various sensors 350a, 350b, 350c, 350d, and 350e on or within a frame 305. In some examples, the various sensors 350a-350e may include any number of depth sensors, motion sensors, position sensors, inertial sensors, and/or ambient light sensors, as shown. In some examples, the various sensors 350a-350e may include any number of image sensors configured to generate image data representing different fields of views in one or more different directions. In some examples, the various sensors 350a-350e may be used as input devices to control or influence the displayed content of the near-eye display, and/or to provide an interactive virtual reality (VR), augmented reality (AR), and/or mixed reality (MR) experience to a user of the near-eye display 300. In some examples, the various sensors 350a-350e may also be used for stereoscopic imaging or other similar application.

In some examples, the near-eye display 300 may further include one or more illuminators 330 to project light into a physical environment. The projected light may be associated with different frequency bands (e.g., visible light, infra-red light, ultra-violet light, etc.), and may serve various purposes. In some examples, the one or more illuminator(s) 330 may be used as locators, such as the one or more locators 126 described above with respect to FIGS. 1-2.

In some examples, the near-eye display 300 may also include a camera 340 or other image capture unit. The camera 340, for instance, may capture images of the physical environment in the field of view. In some instances, the captured images may be processed, for example, by a virtual reality engine (e.g., the virtual reality engine 116 of FIG. 1) to add virtual objects to the captured images or modify physical objects in the captured images, and the processed images may be displayed to the user by the display 310 for augmented reality (AR) and/or mixed reality (MR) applications. The near-eye display 300 may also include eye tracking sensors 312.

Figure 3B:
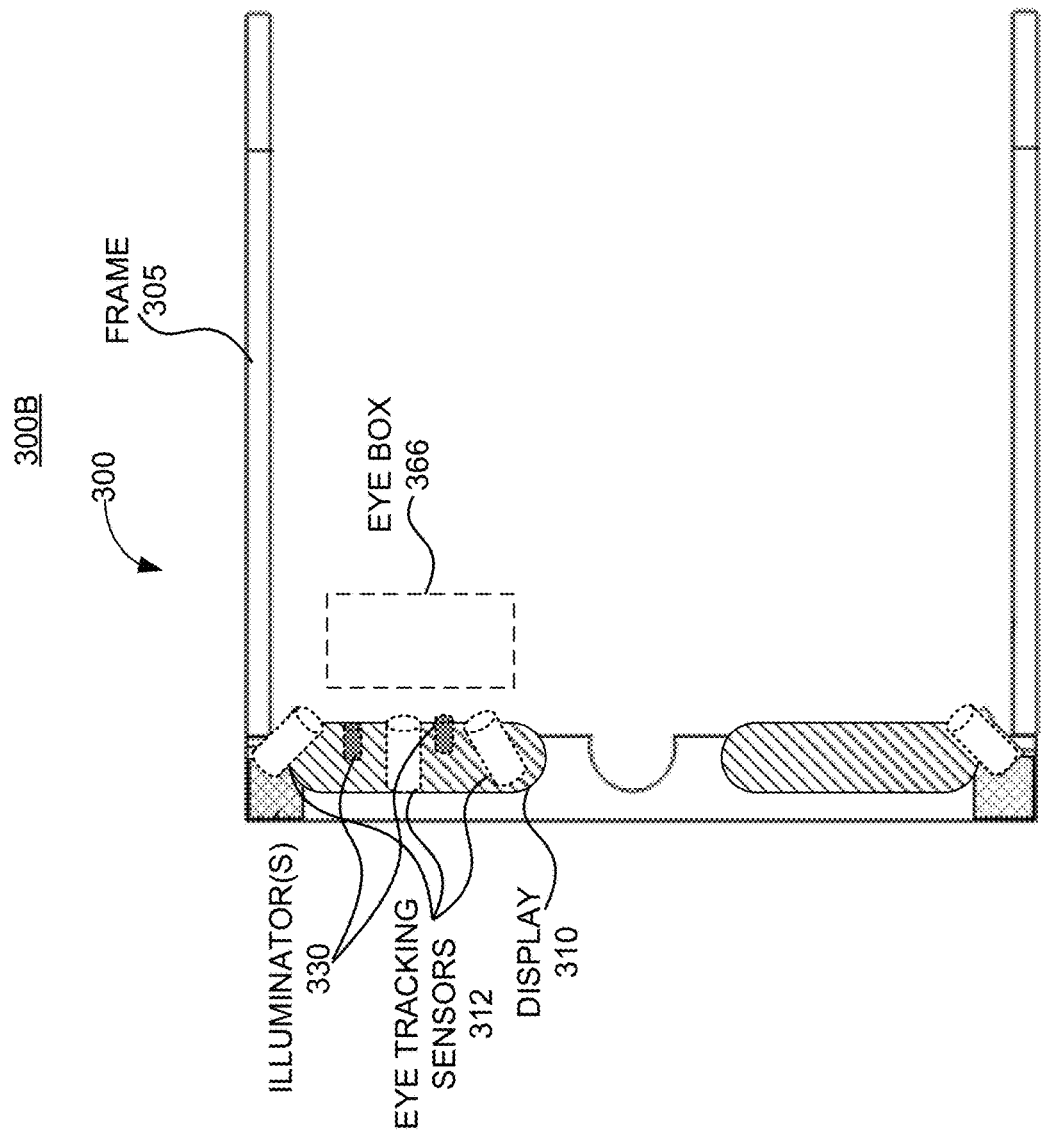

FIG. 3B is a top view 300B of a near-eye display 300 in the form of a pair of glasses (or other similar eyewear), according to an example. In some examples, the near-eye display 300 may include a frame 305 having a form factor of a pair of eyeglasses. The frame 305 supports, for each eye: a fringe projector 314 such as any fringe projector variant considered herein, a display 310 to present content to an eye box 366, eye tracking sensors 312, and one or more illuminators 330. The illuminators 330 may be used for illuminating an eye box 366, as well as, for providing glint illumination to the eye. A fringe projector 314 may provide a periodic fringe pattern onto a user's eye. The display 310 may include a pupil-replicating waveguide to receive the fan of light beams and provide multiple laterally offset parallel copies of each beam of the fan of light beams, thereby extending a projected image over the eye box 366.

In some examples, the pupil-replicating waveguide may be transparent or translucent to enable the user to view the outside world together with the images projected into each eye and superimposed with the outside world view. The images projected into each eye may include objects disposed with a simulated parallax, so as to appear immersed into the real-world view.

The eye tracking sensors 312 may be used to determine position and/or orientation of both eyes of the user. Once the position and orientation of the user's eyes are known, a gaze convergence distance and direction may be determined. In some examples, the eye tracking sensors 312 may be single photon avalanche diode (SPAD) sensors. The imagery displayed by the display 310 may be adjusted dynamically to account for the user's gaze, for a better fidelity of immersion of the user into the displayed augmented reality scenery, and/or to provide specific functions of interaction with the augmented reality. In operation, the illuminators 330 may illuminate the eyes at the corresponding eye boxes 366, to enable the eye tracking cameras to obtain the images of the eyes, as well as to provide reference reflections. The reflections (also referred to as "glints") may function as reference points in the captured eye image, facilitating the eye gazing direction determination by determining position of the eye pupil images relative to the glints. To avoid distracting the user with illuminating light, the latter may be made invisible to the user. For example, infrared light may be used to illuminate the eye boxes 366.

In some examples, the image processing and eye position/orientation determination functions may be performed by a central controller, not shown, of the near-eye display 300. The central controller may also provide control signals to the display 310 to generate the images to be displayed to the user, depending on the determined eye positions, eye orientations, gaze directions, eyes vergence, etc.

Figure 4:
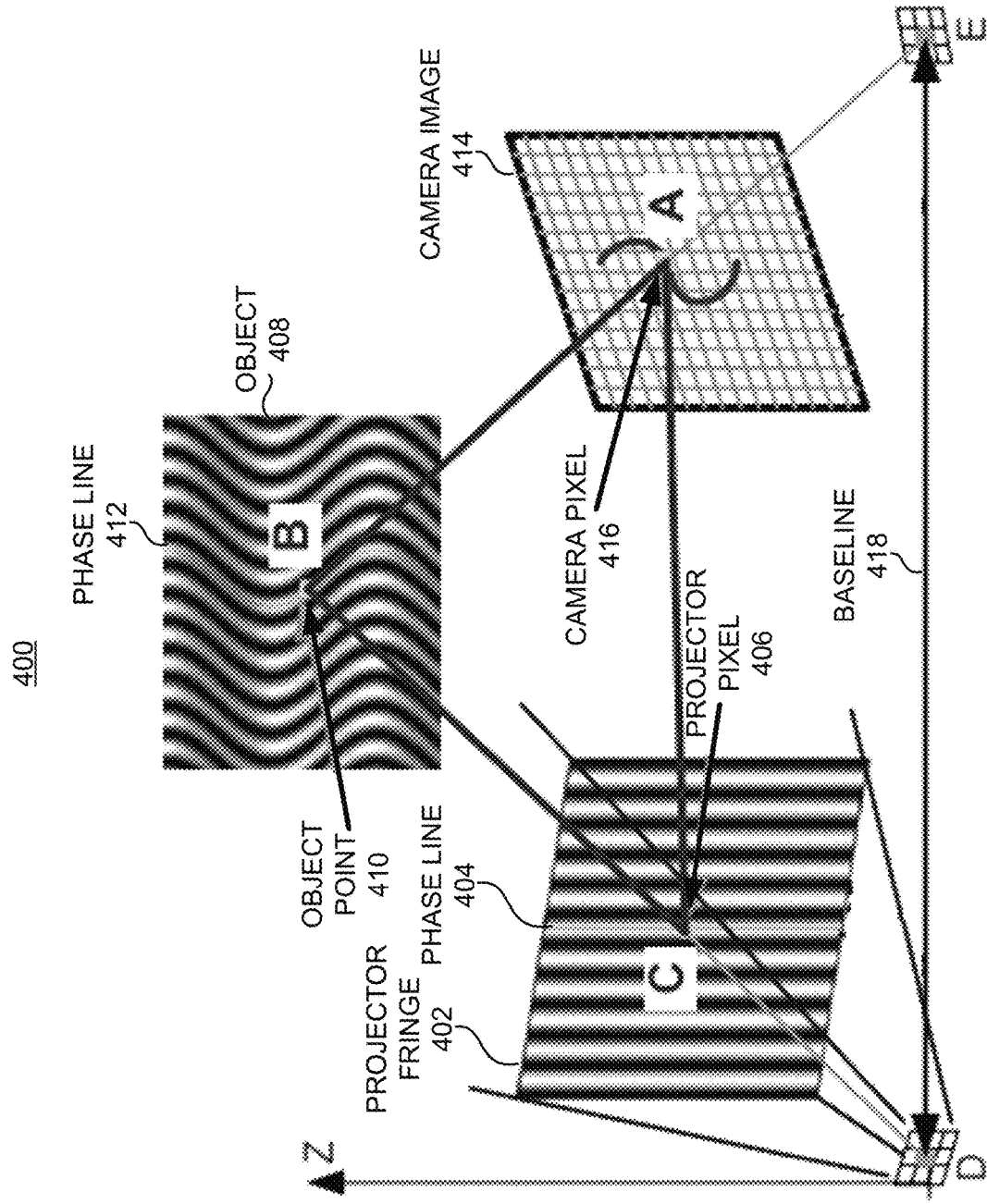
FIG. 4 illustrates a diagram of a structured light based eye tracking system, according to examples.

FIG. 4 illustrates a diagram 400 of a structured light based eye tracking system, according to examples. The diagram 400 shows a light source D projecting a projector fringe 402 (C) with a phase line 404 and a projector pixel 406 onto an object 408 (B) with phase line 412, where the projector pixel 406 is projected as object point 410. The reflected fringe pattern is captured by a camera (sensor) E as camera image 414 (A), where the object point 410 is captured as camera pixel 416.

In some examples, at least one single-photon avalanche diode (SPAD) sensor may be used for the fast image detection. In lower bit single-photon avalanche diode (SPAD) based imaging (e.g., 1 bit to 3 bits), ultrahigh speeds up to a few 10 s of kilo frames per second may be achieved based on the single-photon avalanche diode (SPAD) photon counting capability. However, due to the relatively low photon detection efficiency (PDE) and environmental noise caused false triggering, averaging may be needed and therefore the effective 3D imaging frame rate may be lower. To obtain a high resolution image from the low resolution images captured by the single-photon avalanche diode (SPAD) based sensors, compressive sensing techniques may be employed to enhance image quality.

Single photon avalanche diode (SPAD) sensors may achieve superfast measurement by increasing gain to decrease the integration time. Because of the high gain property, single photon avalanche diode (SPAD) sensors may be affected by the ambient light easily, leading to noise in the measurement. In some examples, narrow band single photon avalanche diode (SPAD) sensors may be used to address noise challenges in the feature matching process and achieve more accurate measurements.

Feature matching refers to finding corresponding features from two similar images based on a search distance algorithm. One of the images may be considered the source and the other as target, and the feature matching technique may be used to either find or derive and transfer attributes from source to target image. The feature matching process may analyze the source and the target image's topology, detect feature patterns, match the patterns, and match the features within the discovered patterns. The accuracy of feature matching may depend on image similarity, complexity, and quality. Thus, reduction of noise due to ambient light in single-photon avalanche diode (SPAD) sensors may provide increased accuracy in detection of three-dimensional (3D) features of the eye, specifically, the pupil, which may then be used to determine the user's gaze.

Figure 5A:
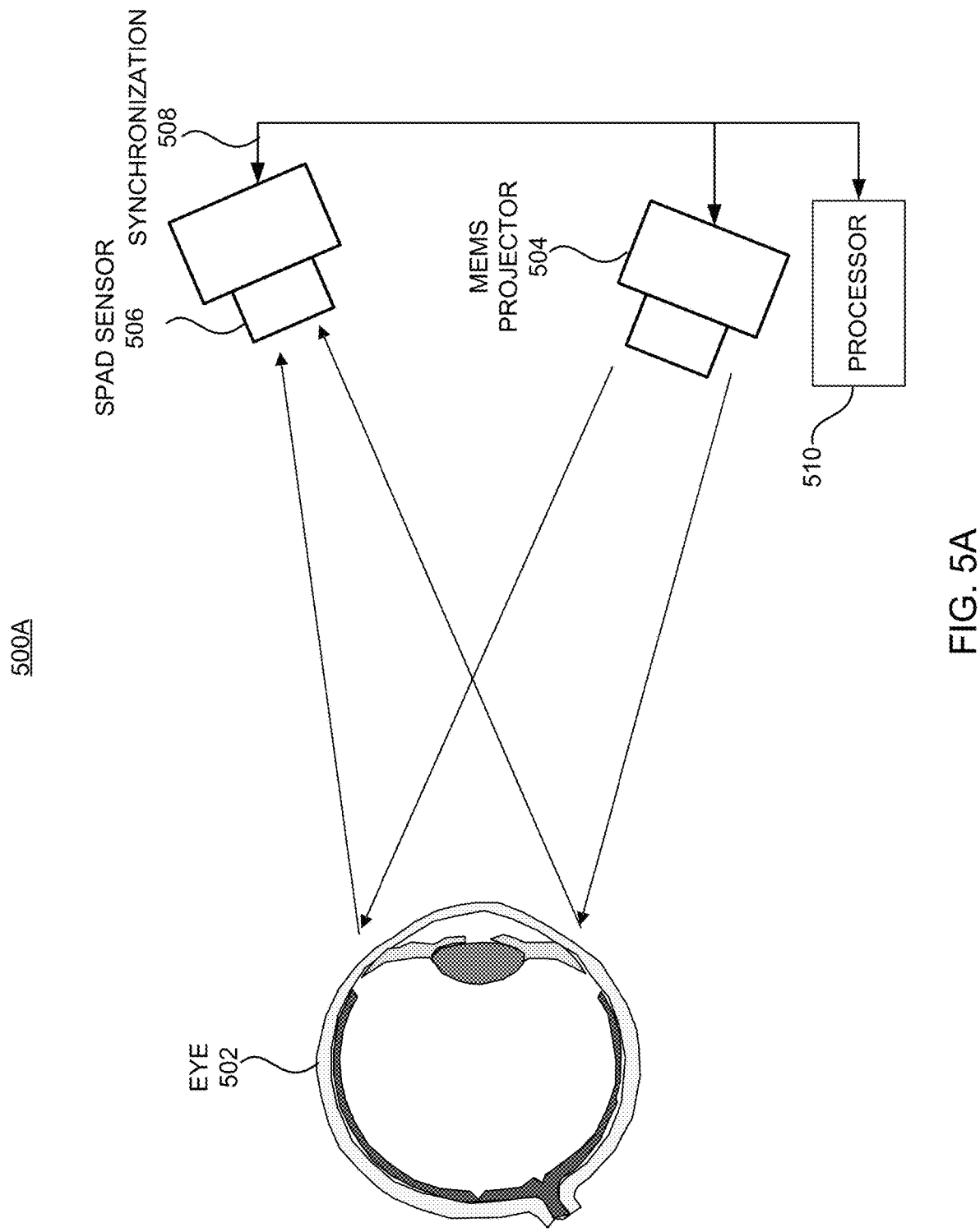
FIGS. 5A-5B illustrate configurations of three-dimensional (3D) compressive sensing based eye tracking systems using single photon avalanche diode (SPAD) sensors, according to examples.
Figure 5B:
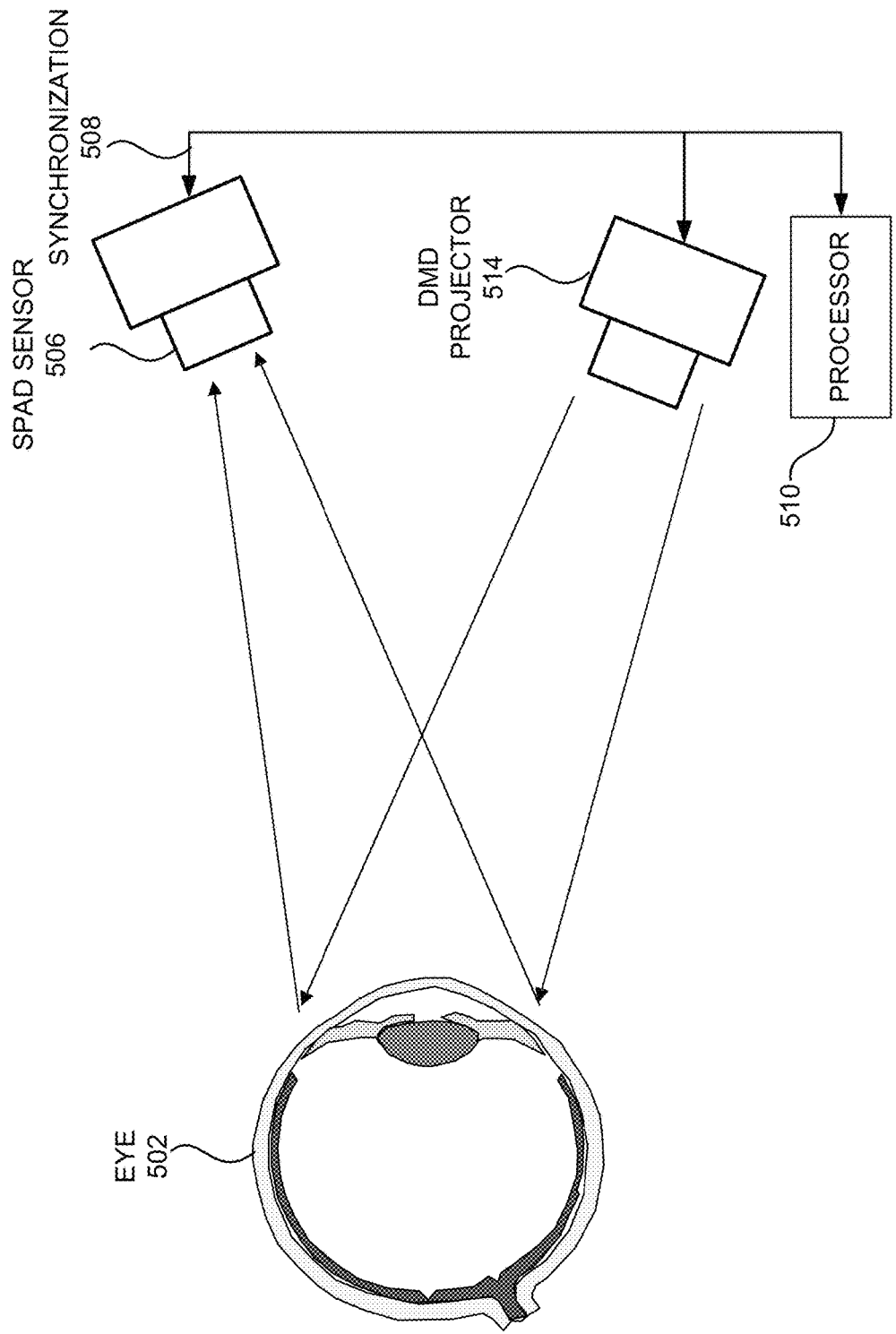

FIGS. 5A-5B illustrate configurations of three-dimensional (3D) compressive sensing based eye tracking systems using single photon avalanche diode (SPAD) sensors, according to examples. Diagram 500A in FIG. 5A shows a micro-electromechanical system (MEMS) based projector 504 projecting active encoded illumination onto a surface of an eye 502, and a reflection of the projected pattern being captured by a low resolution single-photon avalanche diode (SPAD) sensor 506. The micro-electromechanical system (MEMS) based projector 504 and the single-photon avalanche diode (SPAD) sensor 506 may be communicatively coupled to a processor 510, which may temporally synchronize the micro-electromechanical system (MEMS) based projector 504 and the single-photon avalanche diode (SPAD) sensor 506 and process captured images using compressive sensing techniques.

Micro-electromechanical system (MEMS) may be made up of components between 1 and 100 micrometers in size and include a central unit that processes data (e.g., an integrated circuit chip such as microprocessor) and several components that interact with the surroundings such as micromirrors or reflectors. Electrostatic charges or magnetic moments may be employed to achieve movement. In a micro-electromechanical system (MEMS) projector 504, light provided by a collimated light source such as a side-emitting laser diode, a vertical-cavity surface-emitting laser (VCSEL) diode, or a superluminescent light-emitting diode (SLED) may be reflected by at least one micro-electromechanical system (MEMS) reflector onto the eye. The micro-electromechanical system (MEMS) reflector may be moved or scanned in one or more directions to project an active encoded illumination pattern on the eye surface. The micro-electromechanical system (MEMS) reflector may operate, for example, between 10 kHz to 100 kHz, directing the laser light toward the far field, and by controlling the laser intensity and timing, generate a desired pattern on the eye surface.

In some examples, instead of generating vertical lines, two dimensional patterns may be generated through diffractive optical element (DOE) or metasurfaces on the surface of the micro-electromechanical system (MEMS) reflector. This approach may be effective when only a limited number of vertical resolutions are needed for eye tracking. Concentrated optical beam in certain directions may also help enhance signal-to-noise ratio.

Single-photon avalanche diode (SPAD) photodetectors are implemented in CMOS technology whose p-n junction is reverse biased above its breakdown voltage, such that a single photon incident on the active device area can create an electron-hole pair and thus trigger an avalanche of secondary carriers. The avalanche build-up time may be on the order of picoseconds, so that the associated change in voltage may be used to precisely measure the time of the photon arrival. While a single-photon avalanche diode (SPAD) sensor may capture an image at a very high rate, it has a low resolution. For example, a single-photon avalanche diode (SPAD) sensor may have a resolution of 32×32 pixels. Compared to conventional cameras, which may have 8, 12, 16, or higher bit rates, a typical single-photon avalanche diode (SPAD) sensor may have a bit rate between 1 and 4 bits.

Diagram 500B in FIG. 5B shows a similar configuration to the configuration in diagram 500A, but instead of the micro-electromechanical system (MEMS) based projector 504, a digital micromirror device (DMD) projector 514 being used for projection of active encoded illumination onto the eye 502.

A digital micromirror device (DMD) utilizes a large number of microscopically small moving mirrors to an image. A digital micromirror device (DMD) chip may have on its surface several hundred thousand microscopic mirrors arranged in a rectangular array corresponding to pixels of an image to be projected. The mirrors may be rotated ±10-12 degrees, in on or off states. In an on state, light from a light source may be reflected by a mirror making the pixel appear bright. In an off state, the light may be directed elsewhere making the pixel appear dark. The mirrors may be toggled on and off very quickly (e.g., 1-5 microseconds). A light source for the digital micromirror device (DMD) may be a light-emitting diode (LED), a side-emitting laser diode, a vertical-cavity surface-emitting laser (VCSEL) diode, a superluminescent light-emitting diode (SLED), or similar sources.

The mirrors in a digital micromirror device (DMD) may be made of aluminum and have a diameter of about 15 micrometers in some implementations. Each mirror may be mounted on a yoke which in turn may be connected to two support posts by compliant torsion hinges. Two pairs of electrodes may control the position of the mirror by electrostatic attraction. Each pair of electrodes may have one electrode on each side of the hinge, with one of the pairs positioned to act on the yoke and the other acting directly on the mirror. In some implementations, a state of the mirrors may be loaded into a memory (e.g., static random access memory "SRAM"), which may also be connected to the electrodes. Once all the SRAM cells (for all mirrors) are loaded, the bias voltage may be removed, allowing the charges from the SRAM cell to prevail, and thereby moving the mirror. When the bias is restored, the mirror may once again be held in position, and the next movement may be loaded into the respective memory cells.

As mentioned herein, the single-photon avalanche diode (SPAD) sensor 506 may achieve up to 500 kHz image capture rate but operate in 1 or 4 bit more capturing 32×32 pixels at a time. The processor 510 may time-synchronize (508) the single-photon avalanche diode (SPAD) sensor 506 and the digital micromirror device (DMD) projector 514 (or the micro-electromechanical system (MEMS) projector 504 in diagram 500A) ensuring that rapidly projected series of active encoded illumination patterns are captured. The processor 510 may then employ a compressive sensing technique to obtain a high resolution image (e.g., 256×256) from the images captured by the single-photon avalanche diode (SPAD) sensor 506.

In some examples, multiple single-photon avalanche diode (SPAD) sensors may be used to capture reflections of the patterns from the eye surface. In other examples, a linear single-photon avalanche diode (SPAD) sensor array in conjunction with an active micro-electromechanical system (MEMS) shutter array or a two-dimensional single-photon avalanche diode (SPAD) array may be used to capture the reflection as well.

Figure 6B:
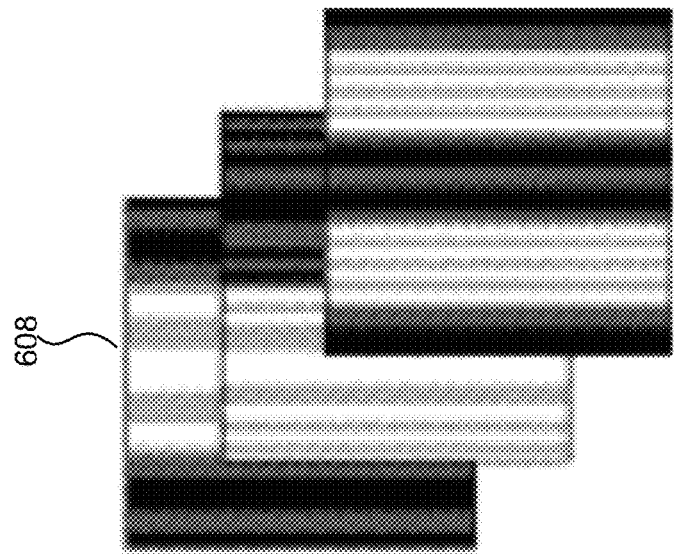
Figure 6B:
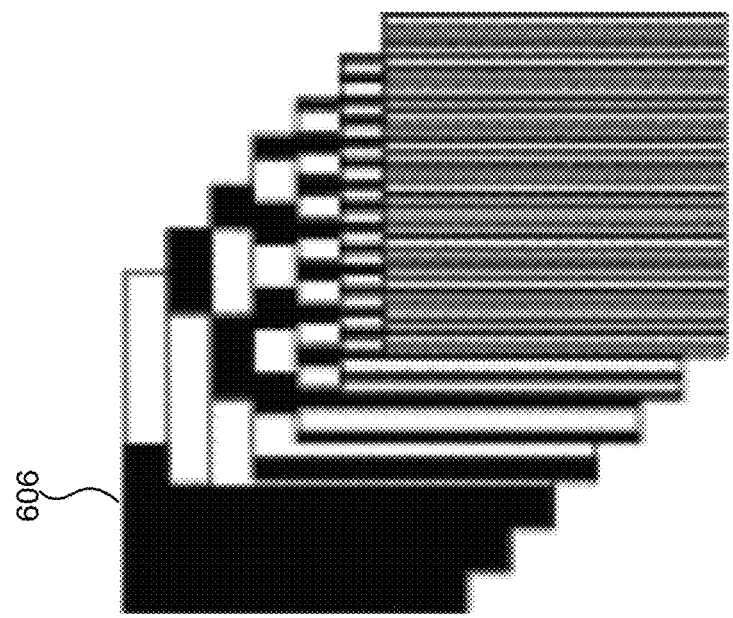

FIGS. 6A-6B illustrate example patterns that may be projected onto an eye surface for three-dimensional (3D) compressive sensing based eye tracking, according to examples. Diagrams 600A and 600B in FIGS. 6A and 6B include example active encoded illumination patterns 602, 604, 606, and 608.

In some examples, the active encoded illumination patterns may include various permutations of standard fringe patterns (vertical or horizontal lines) superimposed with another pattern (e.g., pattern 602), two-dimensional encoded patterns, speckled patterns, random patterns, and combinations of those. Different patterns (e.g., patterns 606) may be projected sequentially at a rapid rate (e.g., up to 500 kHz) and captured synchronously by one or more single-photon avalanche diode (SPAD) sensors. Some pattern sequences may be variations of similar pattern types such as patterns 606 or patterns 608.

Other pattern sequences may include random or pseudo-random patterns. Each different pattern may provide different information, thus more information may be captured about the surface of the eye by using a sequence of varying patterns. In some examples, deterministic basis patterns such as Hadamard sequence of patterns may be used. Such basis patterns may form a complete orthogonal set and allow acquisition of spatial information of object (eye surface) image in a transformation domain. When fully sampled in the transformation domain, the image may be losslessly reconstructed by a corresponding inverse transform. A number of patterns may be selected based on a pattern complexity, and/or system configuration (projector, sensor types).

Compressive sensing is employed for efficiently acquiring and reconstructing an image (or other signals), by finding solutions to underdetermined linear systems based on the principle that, through optimization, a sparsity of a signal may be exploited to recover the signal from fewer samples than required by the Nyquist-Shannon sampling theorem. For reconstruction using compressive sensing, sparsity and incoherence are required conditions, which both exist in eye tracking pattern projection and capture systems. Captured image transformations of the eye surface such wavelet transforms meet sparsity condition (i.e., the coefficients are typically small). Use of sequences of varying (e.g., orthogonal) patterns may meet incoherence requirement.

Compressed sensing may begin with a weighted linear combination of samples in a domain different from the domain in which the signal is sparse. To convert the image back to the intended domain, an underdetermined matrix equation may be solved because a number of compressive measurements is smaller than a number of pixels in the image. However, with the initial signal being sparse, the matrix equation may be solved as an underdetermined system of linear equations. Some example compressive sensing techniques may include, but are not limited to, convex optimizations and adaptive gradient based techniques, which solve a non-convex combinatorial optimization problem. Other example techniques may include greedy algorithms, a less computationally complex set of algorithms that obtain a sparsest solution of the system; and threshold based algorithms (iterative hard and soft thresholding, automated thresholding, etc.), which are based on an adaptive threshold applied within several iterations.

Figure 7:
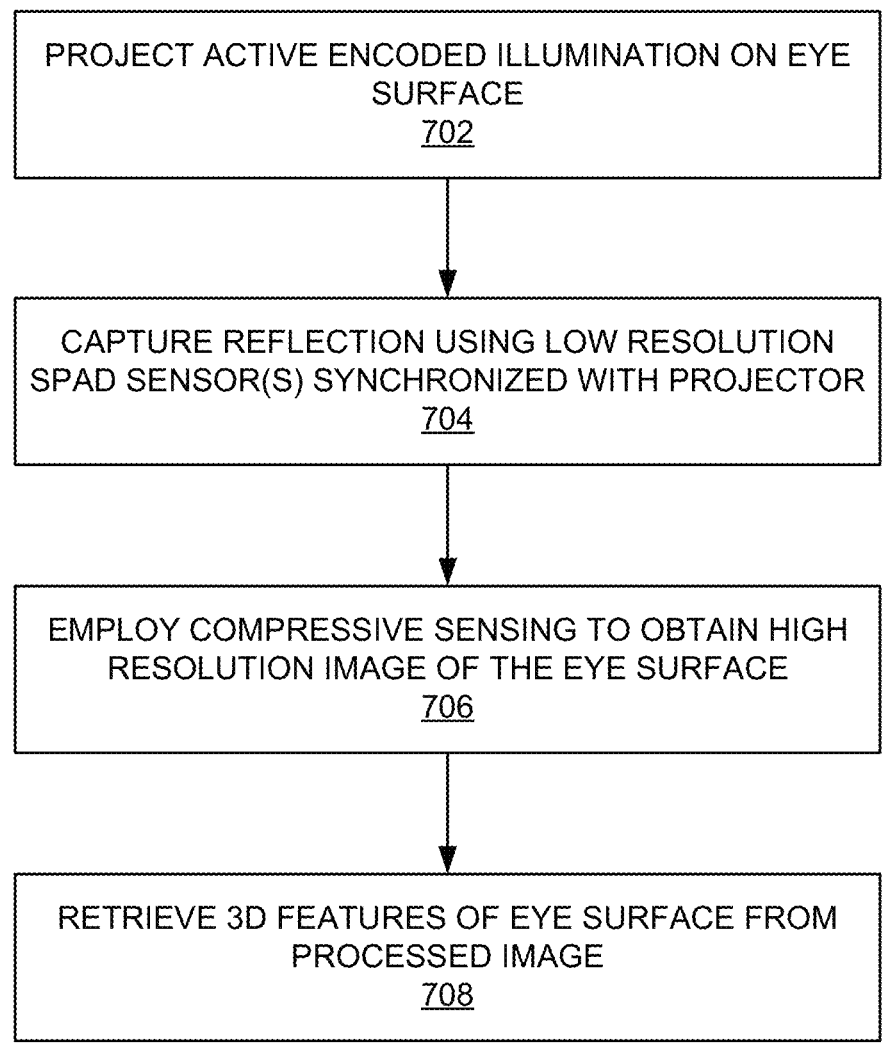
FIG. 7 illustrates a flow diagram of a method for three-dimensional (3D) compressive sensing based eye tracking using single photon avalanche diode (SPAD) sensors, according to some examples.

FIG. 7 illustrates a flow diagram of a method 700 for three-dimensional (3D) compressive sensing based eye tracking using single photon avalanche diode (SPAD) sensors, according to some examples. The method 700 is provided by way of example, as there may be a variety of ways to carry out the method described herein. Although the method 700 is primarily described as being performed by the components of FIGS. 5A, 5B, the method 700 may be executed or otherwise performed by one or more processing components of another system or a combination of systems. Each block shown in FIG. 7 may further represent one or more processes, methods, or subroutines, and one or more of the blocks (e.g., the selection process) may include machine readable instructions stored on a non-transitory computer readable medium and executed by a processor or other type of processing circuit to perform one or more operations described herein.

At block 702, active encoded illumination patterns such as two-dimensional encoded patterns, speckled patterns, random patterns, and combinations thereof may be projected onto a surface of an eye at a rapid rate (e.g., up to 500 kHz). The projector may include a laser source and an ultra-fast scanning micro-electromechanical system (MEMS) based projector or a digital micromirror device (DMD) projector with a suitable light source.

At block 704, one or more 2D single-photon avalanche diode (SPAD) sensors or single-photon avalanche diode (SPAD) array detector may be used to capture a reflection of the projected pattern from the surface of the eye. The single-photon avalanche diode (SPAD) sensor(s) may be low resolution sensors, for example, operating in 1-bit or 4-bit modes and be time-synchronized with the projector such that the sensor(s) capture each projected pattern.

At block 706, compressive sensing techniques may be applied on the captured images of the reflected patterns. Captured image transformations of the eye surface such wavelet transforms meet sparsity condition, and the sequences of varying (e.g., orthogonal) patterns may meet incoherence requirement for compressive sensing. High resolution image and depth information may be retrieved from the captured images through compressive sensing.

At block 708, 3D features of the surface of the eye may be retrieved from the high resolution information. The features may be retrieved through feature matching by finding corresponding features from two similar images based on a search distance algorithm. One of the images may be considered the source and the other as target, and the feature matching technique may be used to either find or derive and transfer attributes from source to target image. The feature matching process may analyze the source and the target image's topology, detect feature patterns, match the patterns, and match the features within the discovered patterns. The user's gaze may then be inferred from the retrieved features.

According to examples, a method of making a three-dimensional (3D) compressive sensing based eye tracking system using single photon avalanche diode (SPAD) sensors is described herein. A system of making the eye tracking system is also described herein. A non-transitory computer-readable storage medium may have an executable stored thereon, which when executed instructs a processor to perform the methods described herein.

In the foregoing description, various examples are described, including devices, systems, methods, and the like. For the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples.

The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

Although the methods and systems as described herein may be directed mainly to digital content, such as videos or interactive media, it should be appreciated that the methods and systems as described herein may be used for other types of content or scenarios as well. Other applications or uses of the methods and systems as described herein may also include social networking, marketing, content-based recommendation engines, and/or other types of knowledge or data-driven systems.

The invention claimed is:

1. An eye tracking system, comprising:
   a projector to project a sequence of active encoded illumination patterns onto a surface of an eye of a user;
   a single-photon avalanche diode (SPAD) based sensor system to capture reflections of the active encoded illumination patterns from the surface of the eye; and
   a processor to:
     synchronize a rate of the projector projecting the active encoded illumination patterns with a rate of the SPAD based sensor system capturing the reflections of the active encoded illumination patterns;
     employ compressive sensing to process the captured reflections of the active encoded illumination patterns to obtain high resolution images from the captured reflections; and
     determine three-dimensional (3D) features of the surface of the eye from the high resolution images, wherein the 3D features of the surface of the eye are used to determine a gaze of the user.

2. The eye tracking system of claim 1, wherein the projector is to project the active encoded illumination patterns onto the surface of the eye at a rate of up to 500 KHz.

3. The eye tracking system of claim 1, wherein the SPAD based sensor system comprises at least one SPAD sensor, a linear SPAD sensor array, or a two-dimensional SPAD sensor array.

4. The eye tracking system of claim 1, wherein the projector comprises:
   a laser source to provide a collimated light; and
   a micro-electromechanical system (MEMS) reflector to project the active encoded illumination patterns at the specific rate by directing the collimated light.

5. The eye tracking system of claim 4, wherein the processor is to synchronize the rate of SPAD based sensor system capturing the reflections of the active encoded illumination patterns with the specific rate of the MEMS reflector projecting the active encoded illumination patterns.

6. The eye tracking system of claim 4, wherein the MEMS reflector operates at the specific rate of 500 KHz.

7. The eye tracking system of claim 1, wherein the projector comprises:
   a light source to provide light; and
   a digital micromirror device (DMD) reflector to project the active encoded illumination patterns by directing the light from the light source.

8. The eye tracking system of claim 7, wherein the light source comprises a side-emitting laser diode, a vertical-cavity surface-emitting laser (VCSEL) diode, a superluminescent light-emitting diode (SLED), or a light-emitting diode (LED).

9. The eye tracking system of claim 1, wherein the active encoded illumination patterns comprise two-dimensional encoded patterns, speckled patterns, random patterns, and combinations thereof.

10. The eye tracking system of claim 9, wherein a number of the active encoded illumination patterns is selected based on at least one of a pattern complexity, a projector type, and a sensor system type.

11. A method for operating an eye tracking system, comprising:
    projecting, by a projector in the eye tracking system, a sequence of active encoded illumination patterns onto a surface of an eye of a user at a specific rate;
    capturing, by a single-photon avalanche diode (SPAD) based sensor system in the eye tracking system, reflections of the active encoded illumination patterns from the surface of the eye at a same rate as the specific rate of the projector projecting the active encoded illumination patterns;
    employing compressive sensing, by a processor in the eye tracking system, to process the captured reflections of the active encoded illumination patterns to obtain high resolution images from the captured reflections;
    determining, by the processor, three-dimensional (3D) features of the surface of the eye from the high resolution images; and
    determining, by the processor, a gaze of the user based on the 3D features of the surface of the eye.

12. The method of claim 11, wherein projecting the sequence of the active encoded illumination patterns onto the surface of the eye comprises:
    projecting deterministic patterns or random patterns onto the surface of the eye.

13. The method of claim 12, wherein
    the deterministic patterns comprise orthogonal patterns or two-dimensional encoded patterns, and
    the random patterns comprise speckled patterns or pseudo-random patterns.

14. The method of claim 11, further comprising:
    selecting a number of the active encoded illumination patterns based on at least one of a pattern complexity, a projector type, and a sensor system type.

15. The method of claim 11, wherein projecting the sequence of the active encoded illumination patterns comprises:
    providing a collimated light from a laser source to a micro-electromechanical system (MEMS) reflector; and projecting the active encoded illumination patterns at the specific rate by directing the collimated light from the MEMS reflector onto the surface of the eye,
wherein the SPAD based sensor system is to capture the reflections of the active encoded illumination patterns at the same rate as the specific rate of the MEMS reflector projecting the active encoded illumination patterns.

16. The method of claim 11, wherein projecting the sequence of the active encoded illumination patterns comprises:
providing light from a light source to a digital micromirror device (DMD) reflector; and
projecting the sequence of the active encoded illumination patterns by directing the light from the light source from the DMD reflector onto the surface of the eye.

17. A non-transitory computer-readable storage medium storing machine readable instructions which when executed by a processor cause the processor to:
cause a projector in an eye tracking system to project a sequence of active encoded illumination patterns onto a surface of an eye at a specific rate;
cause a single-photon avalanche diode (SPAD) based sensor system in the eye tracking system to capture reflections of the active encoded illumination patterns from the surface of the eye at a same rate as the specific rate of the projector projecting the active encoded illumination patterns;
employ compressive sensing to process the captured reflections of the active encoded illumination patterns to obtain high resolution images from the captured reflections;
determine three-dimensional (3D) features of the surface of the eye from the high resolution images; and
determine a gaze of the user based on the 3D features of the surface of the eye.

18. The non-transitory computer-readable storage medium of claim 17, wherein the machine readable instructions cause the processor to select a number of the active encoded illumination patterns based on at least one of a pattern complexity, a projector type, and a sensor system type.

19. The non-transitory computer-readable storage medium of claim 17, wherein the active encoded illumination patterns comprise orthogonal deterministic patterns or random patterns.

20. The non-transitory computer-readable storage medium of claim 17, wherein the projector comprises a micro-electromechanical system (MEMS) reflector to project the active encoded illumination patterns onto the surface of the eye at the specific rate, and
wherein the instructions cause the processor to synchronize the rate of SPAD based sensor system capturing the reflections of the active encoded illumination patterns with the specific rate of the MEMS reflector projecting the active encoded illumination patterns.

* * * * *